(12) United States Patent
Edde

(10) Patent No.: US 7,714,631 B2
(45) Date of Patent: May 11, 2010

(54) METHOD AND APPARATUS FOR SYNCHRONIZING A CLOCK GENERATOR IN THE PRESENCE OF JITTERY CLOCK SOURCES

(75) Inventor: Gabriel Alfred Edde, Indianapolis, IN (US)

(73) Assignee: Thomson Licensing, Boulogne-Billancourt (FR)

( * ) Notice: Subject to any disclaimer, the term of this patent is extended or adjusted under 35 U.S.C. 154(b) by 179 days.

(21) Appl. No.: 11/596,241

(22) PCT Filed: May 5, 2005

(86) PCT No.: PCT/US2005/015843

§ 371 (c)(1),
(2), (4) Date: Sep. 11, 2008

(87) PCT Pub. No.: WO2005/114845

PCT Pub. Date: Dec. 1, 2005

(65) Prior Publication Data

US 2009/0009221 A1 Jan. 8, 2009

Related U.S. Application Data

(60) Provisional application No. 60/570,604, filed on May 13, 2004.

(51) Int. Cl.
*H03K 3/00* (2006.01)
(52) U.S. Cl. .......................... 327/291; 327/296; 327/154
(58) Field of Classification Search ................... 327/141, 327/144, 154, 291, 293–297, 113–115, 117
See application file for complete search history.

(56) References Cited

U.S. PATENT DOCUMENTS 5,742,650 A * 4/1998 Nuckolls et al. ............ 375/376
6,111,442 A 8/2000 Aulet et al.

(Continued)

FOREIGN PATENT DOCUMENTS

DE 201 13 507 U1 12/2001

(Continued)

OTHER PUBLICATIONS

Search Report dated Nov. 1, 2005.

*Primary Examiner*—An T Luu
(74) *Attorney, Agent, or Firm*—Robert D. Shedd; Robert B. Levy; Jeffrey D. Hale

(57) ABSTRACT

There are provided, in a clock generator for generating a plurality of output clock signals, an apparatus and method for synchronizing the clock generator to an input reference clock in the presence of a jittery input clock provided to the clock generator from a PLL. The clock generator and the PLL each have a divider with the same ratio. The apparatus includes a synchronizer (205) and a state machine (210). The synchronizer receives the input reference clock and the jittery input clock, and generates there from a synchronized input clock signal with respect to the jittery input clock. The state machine receives the synchronized input clock signal and the jittery input clock, synchronizes with the synchronized input clock signal using the jittery input clock, and abstains from a re-synchronizing operation when the jittery input clock has a jitter of up to a pre-defined maximum number of clock widths.

15 Claims, 4 Drawing Sheets

U.S. PATENT DOCUMENTS 6,329,861 B1 12/2001 Francis
6,563,349 B2 5/2003 Menezes et al.
6,907,541 B1 * 6/2005 Padmanabhan et al. ..... 713/503
2001/0009275 A1 7/2001 Jung et al.
2003/0030473 A1 2/2003 Lee

FOREIGN PATENT DOCUMENTS

EP 1 139 201 A2 10/2001

* cited by examiner

METHOD AND APPARATUS FOR SYNCHRONIZING A CLOCK GENERATOR IN THE PRESENCE OF JITTERY CLOCK SOURCES

This application claims the benefit, under 35 U.S.C. § 365 of International Application PCT/US2005/015843, filed May 5, 2005, which was published in accordance with PCT Article 21(2) on Dec. 1, 2005 in English and which claims the benefit of U.S. provisional patent application No. 60/570,604, filed May 13, 2004.

FIELD OF THE INVENTION

The present invention generally relates to clock generators and, more particularly, to a method and apparatus for synchronizing a clock generator in the presence of a jittery clock source.

BACKGROUND OF THE INVENTION

In designing digital integrated circuits (ICs), it is often necessary to create a high frequency clock from a lower frequency reference clock. Often, data enters an IC at a reference frequency, but the logic in the IC needs to be clocked at a much higher frequency. The higher frequency clock is typically obtained using a phase-locked loop (PLL). For example, in the IC, a clock generator block is employed that references (or locks to) divider states in the PLL to properly phase a clock generator. This means of synchronizing/phasing the clock generator becomes more difficult when the PLL divider states are not observable from outside the PLL. A typical case in which the divider states of a PLL are not observable can occur when one purchases a PLL from a vendor. The vendor provides a pre-laid out section of silicon with all of the PLL components optimized and debugged to be placed in an application specific integrated circuit (ASIC) design. Intuitively, it would seem that it is an easy thing to synchronize the data to one of the phases of the PLL clock, but a problem occurs due to the fact that a PLL has time jitter or wander (hereinafter "jitter") with respect to the input reference clock. Typically, this time jitter is very small. Nonetheless, the jitter causes the synchronizer to periodically re-phase the clock generator state machine based on the instantaneous phase difference between the reference frequency and the high frequency clock from the PLL.

Accordingly, it would be desirable and highly advantageous to have a method and apparatus for synchronizing a clock generator in the presence of a jittery clock source.

SUMMARY OF THE INVENTION

These and other drawbacks and disadvantages of the prior art are addressed by the present invention, which is directed to a method and apparatus for synchronizing a clock generator in the presence of a jittery clock source.

According to an aspect of the present invention, there is provided, in a clock generator for generating a plurality of output clock signals, an apparatus for synchronizing the clock generator to an input reference clock in the presence of a jittery input clock provided to the clock generator from a phase locked loop (PLL). The clock generator and the PLL each have a divider with the same ratio. The apparatus includes a synchronizer and a clock generator state machine. The synchronizer is for receiving the input reference clock and the jittery input clock, and for generating there from a synchronized input clock signal with respect to the jittery input clock. The clock generator state machine is for receiving the synchronized input clock signal and the jittery input clock, for synchronizing with the synchronized input clock signal using the jittery input clock, and for abstaining from a re-synchronizing operation when the jittery input clock has a jitter of up to a pre-defined maximum number of clock widths.

According to another aspect of the present invention, there is provided, in a clock generator for generating a plurality of output clock signals, a method for synchronizing the clock generator to an input reference clock in the presence of a jittery input clock provided to the clock generator from a phase locked loop (PLL). The clock generator and the PLL each have a divider with the same ratio. The input reference clock and the jittery input clock are received. A synchronized input clock signal is generated there from with respect to the jittery input clock. The synchronized input clock signal is synchronized with using the jittery input clock. A re-synchronizing operation is abstained from when the jittery input clock has a jitter of up to a pre-defined maximum number of clock widths.

These and other aspects, features and advantages of the present invention will become apparent from the following detailed description of exemplary embodiments, which is to be read in connection with the accompanying drawings.

BRIEF DESCRIPTION OF THE DRAWINGS

The present invention may be better understood in accordance with the following exemplary figures, in which.

DETAILED DESCRIPTION OF PREFERRED EMBODIMENTS

Figure 1:
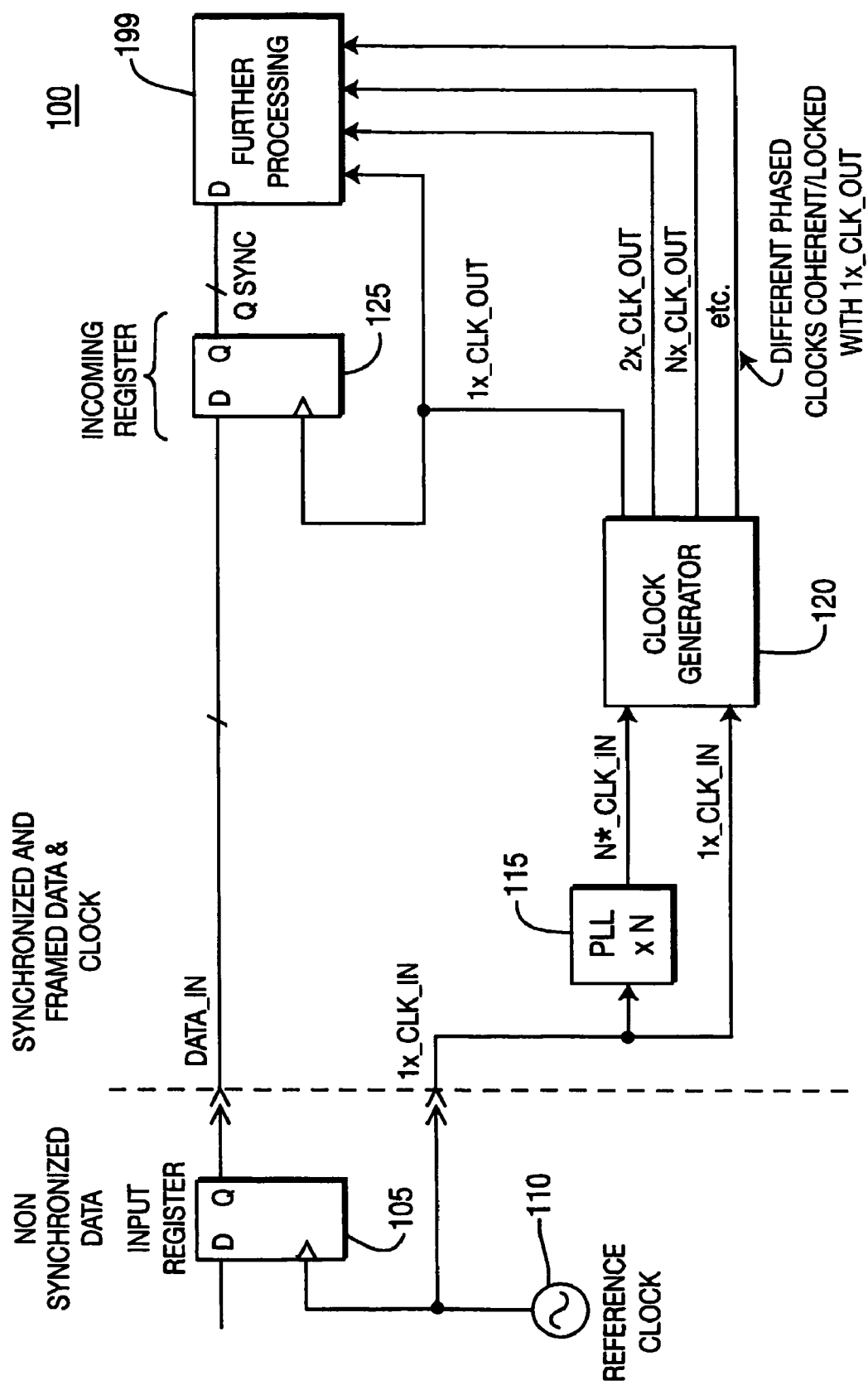
FIG. 1 shows a block diagram for an exemplary phase locked loop (PLL) system in which the present invention may be applied, in accordance with an illustrative embodiment of the present invention.

The present invention is directed to a method and apparatus for synchronizing a clock generator in the presence of a jittery clock source. Advantageously, the present invention provides an apparatus and method for synchronizing a clock generator to an input reference clock when the clock generator uses a clock that is locked in the long term but wanders in the short term with respect to the reference clock. That is, the present invention provides an apparatus and method for synchronizing a clock generator in a digital system with an external PLL generated clock. The present invention solves the problem in which a PLL is used to generate a high frequency clock from a lower frequency clock where one needs to properly phase a clock generator with the divider in the PLL, but the internal clock divider signals of the PLL are not observable or available.

The present description illustrates the principles of the present invention. It will thus be appreciated that those skilled in the art will be able to devise various arrangements that, although not explicitly described or shown herein, embody the principles of the invention and are included within its spirit and scope.

All examples and conditional language recited herein are intended for pedagogical purposes to aid the reader in understanding the principles of the invention and the concepts contributed by the inventor to furthering the art, and are to be construed as being without limitation to such specifically recited examples and conditions.

Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the block diagrams presented herein represent conceptual views of illustrative circuitry embodying the principles of the invention. Similarly, it will be appreciated that any flow charts, flow diagrams, state transition diagrams, pseudocode, and the like represent various processes which may be substantially represented in computer readable media and so executed by a computer or processor, whether or not such computer or processor is explicitly shown.

The functions of the various elements shown in the figures may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor ("DSP") hardware, read-only memory ("ROM") for storing software, random access memory ("RAM"), and non-volatile storage.

Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

It is to be appreciated that for some of the elements disclosed herein, certain known inputs and outputs thereof that are not used to implement the present invention may not mentioned herein for the sake of brevity and clarity. For example, register inputs such as set and/or reset, and register outputs such as Q complimentary, when not required by the present invention, may not mentioned. Of course, equivalents are encompassed by the present invention such as, for example, adding two inverters in series subsequent to an output to obtain that same output. These and other equivalents, as readily contemplated by one of ordinary skill in the related art, are encompassed by the present invention.

In the claims hereof, any element expressed as a means for performing a specified function is intended to encompass any way of performing that function including, for example, a) a combination of circuit elements that performs that function or b) software in any form, including, therefore, firmware, microcode or the like, combined with appropriate circuitry for executing that software to perform the function. The invention as defined by such claims resides in the fact that the functionalities provided by the various recited means are combined and brought together in the manner which the claims call for. Applicant thus regards any means that can provide those functionalities as equivalent to those shown herein.

Turning to FIG. 1, an exemplary phase locked loop (PLL) system in which the present invention may be applied is generally indicated by the reference numeral 100. The system 100 includes an input register 105, a reference clock 110, a phase locked loop (PLL) 115, a clock generator 120, and an incoming register 125.

The input register 105 includes a D input, a clock input, and a Q output. The incoming register 125 includes a D input, a clock input, and a Q output.

An input to the system 100 is connected in signal communication with the D input of the input register 105. The input to the system 100 is for receiving non-synchronized data.

An output of the reference clock 110 is connected in signal communication with the clock input of the input register 105, with an input of the PLL 115, and with a first input of the clock generator 120. The output of the reference clock 110 is also referred to herein as "1x_CLK_IN" and as the "original reference clock". An output of the PLL 115 is connected in signal communication with a second input of the clock generator 120. The output of the PLL 115 is also referred to herein as N*CLK_IN.

The Q output of the input register 105 is connected in signal communication with the D input of the incoming register 125. The Q output of the incoming register 125 continues onto further processing with respect to system 100. The further processing is generally indicated by a further processing block 199

A first output (1x_CLK_OUT) of the clock generator 120 is connected in signal communication with the clock input of the incoming register 125 and continues onto further processing (further processing block 199).

Second though N outputs (2x_CLK_OUT through Nx_CLK_OUT) of the clock generator 120 continue onto further processing (further processing block 199). The second through N output of the clock generator 120 are coherent/locked with the first output of the clock generator (1x_CLK_OUT).

For purposes of illustration and clarity, it is presumed for the following description that the high frequency clock (N*CLK_IN) operates at six times the frequency of the input reference clock (1X_CLK_IN) to make it easier to describe (thus, N=6). However, it is to be appreciated that the present invention is not limited to the preceding clock speeds, multiples thereof, and frequency ratios and, thus, other clock speeds, multiples thereof, and frequency ratios may also be employed in accordance with the present invention, while maintaining the spirit of the present invention.

DATA_IN data is clocked at 1X_CLK_IN. It is to be appreciated that while DATA_IN is shown being output from a simple register, it can be output from any other element that is clocked with the input reference (reference clock 120) including, but not limited to, an Analog-to-Digital Converter (ADC). Since the logic in the further processing block 199 requires a higher frequency in its operation, PLL 115 is used to create a high frequency clock (N*CLK_IN). This high frequency clock (N*CLK_IN) as well as the original reference clock (1X_CLK_IN) are fed to the clock generator 120 to properly phase the output clocks 1X_CLK_OUT, 2X_CLK_OUT, . . . , NX_CLK_OUT, and so forth. The purpose of the clock generator 120 is to lock and phase its output clocks to the 1X_CLK_IN reference as well as provide proper D to clock setup time to the incoming register 125. As is known, a certain "setup" condition needs to be met where the data presented at the "D" input (in this case, of the incoming register 125) is stable a minimum time before the clock (in this case, 1X_CLK_OUT) arrives. Since the magnitude of the jitter from the 1X_CLK_OUT is large enough to sometimes violate the "setup time" of the incoming register 125, there will be data errors in the QSYNC output of the incoming register 125 with respect the input data DATA_IN. To keep from violating the setup time of the incoming register 125, the 1X_CLK_OUT is delayed in phase with respect to the reference 1X_CLK_IN by an amount to guarantee meeting the incoming register's setup requirements.

Figure 2:
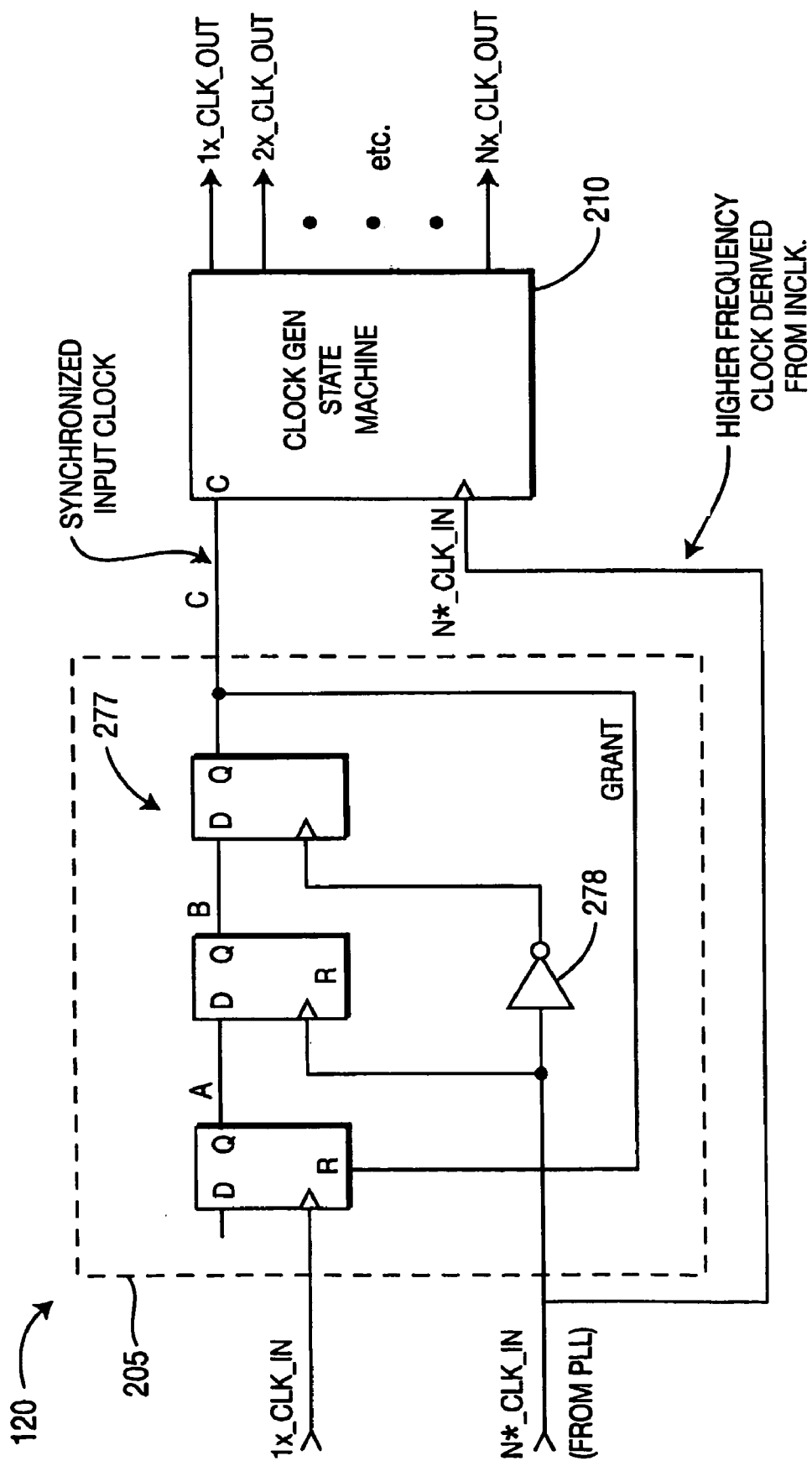
FIG. 2 shows a block diagram further illustrating the clock generator 120 of FIG. 1, according to an illustrative embodiment of the present invention.
Figure 4:
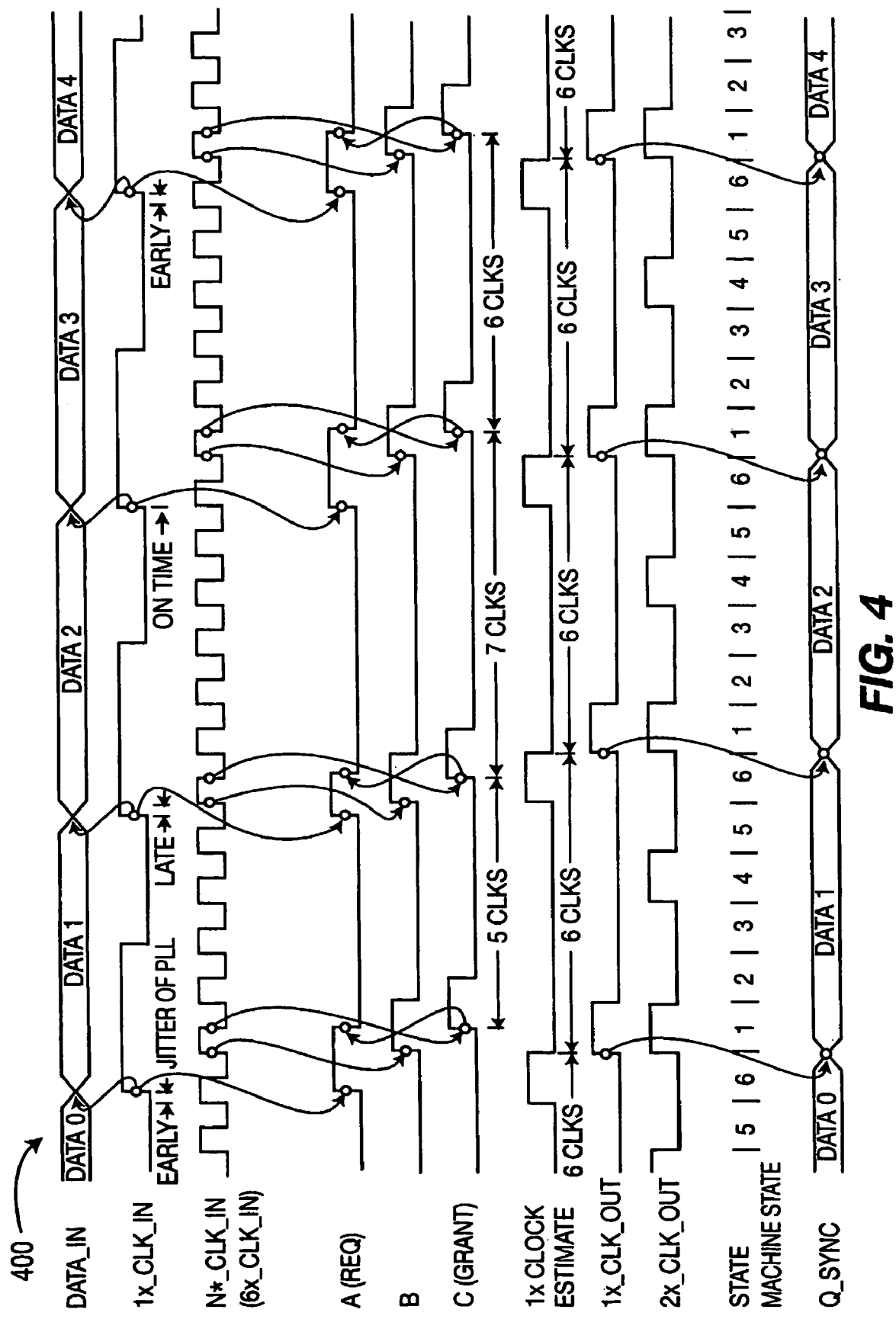
FIG. 4 shows a timing diagram for the signals in the system 100 of FIG. 1, according to an illustrative embodiment of the present invention.

Turning to FIG. 2, the clock generator 120 of FIG. 1 is shown in further detail. Also turning to FIG. 4, an exemplary timing diagram for the signals in the system 100 of FIG. 1 is generally indicated by the reference numeral 400.

The clock generator 120 includes a synchronizer 205 and a clock generator state machine 210. The synchronizer 205 includes a first register 205A, a second register 205B and a third register 205C. The first register 205 A, the second register 205B, and the third register 205C each have a D input, a clock input, a reset input, and a Q output. As the reset input of the second register 205B and the third register 205 C are not critical the description of the present invention, there are not shown in FIG. 2. The clock generator state machine 210 includes a C input, a clock input, and a plurality of outputs.

The original reference clock (1X_CLK_IN) is input to synchronizer 205, in particular, to the clock input of the first register 205A. The D input of the first register 205A is connected in signal communication with a positive input voltage. The Q output of the first register 205A is connected in signal communication with the D input of the second register 205B. The Q output of the second register 205B is connected in signal communication with the D input of the third register 205C.

The high frequency clock (N*CLK_IN) is input to the synchronizer, in particular, to the reset input of the first register 205A, the clock input of the second register 205B, and the clock input of the third register 205C after being inverted by inverter 299. The high frequency clock (N*CLK_IN) is also input to the clock input of the clock generator state machine 210. The Q output of the third register 205C is connected in signal communication with the C input of the clock generator state machine 210.

The synchronizer 205 is used as an input to control the clock generator state machine 210. In the specific implementation shown in FIG. 2, the synchronizer 205 includes a plurality of flip flops 277 and an inverter 278. However, it is to be appreciated that the synchronizer 205 shown and described herein is for illustrative purposes and, thus, other synchronizers having other configurations and elements therein may also be employed in accordance with the present invention, while maintaining the spirit of the present invention.

The purpose of the synchronizer 205 is to create a synchronized input clock signal with respect to the high frequency clock (N*CLK_IN) to be fed to the clock generator state machine 210 to allow phasing and locking. Note that the internal divider in the PLL 115 is set to the same ratio as a divider in the clock generator 120 (in this example N=6, however N may be equal to any number greater than 2). Thus, the output clock frequencies of the clock generator state machine 210 will not drift with respect to the input reference clock (1X_CLK_IN) 110. Due to the time jitter of the PLL response, there are 3 possible conditions of N*CLK_IN with respect to 1X_CLK_IN depending on the instantaneous phase jitter of the PLL response. The three conditions are as follows: early, where N*CLK_IN leads 1X_CLK_IN; late, where N*CLK_IN lags 1X_CLK_IN; and on time, where N*CLK_IN is exactly timed with 1X_CLK_IN. These three conditions are shown together on FIG. 4.

Under "steady state" conditions, when any of the "early", "late", or "on time" conditions occur, the state machine should be in state 6 or 1. Otherwise, the state machine will jump to state 1 to re-phase itself. This is why there is not a "/C" jump constraint between states 1 and 2 nor between states 6 and 1 in the state diagram of FIG. 3. "C" in the state machine is the synchronized input clock pulse from FIG. 2. The state machine has an "intentional slop or okay zone" built in to it so that jitter on the order of 2 clocks wide or less will not cause the state machine to re-phase itself. Ultimately, it is desirable under steady state for the state machine 210 to traverse through states 1 through 6 and repeat without ever re-synchronizing after the initial synchronization when the power is first applied to the ASIC. It is to be appreciated that while the present invention is described as having an "okay zone", during which the state machine will not re-phase itself, as 2 clock widths or less, the present invention is not limited to that precise constraint and, thus, other clock widths may also be employed by the present invention, while maintaining the spirit of the present invention.

Synchronizer signals A, B, and C illustrate the internal behavior of the synchronizer 205 as it synchronizes to the 1X_CLK_IN signal. Normally, one would use the output C of the synchronizer 205 directly to control the clock generator state machine 210. However, from looking at the timing diagram, note that even though the 1X_CLK_IN signal rising edge occurs every 6 clocks of N*CLK_IN, signal C from the synchronizer sometimes occurs at 5, 6, or 7 clock cycle increments. From close inspection of the timing diagram, one can see that this is caused by the time jitter of the N*CLK_IN signal from the PLL 115. Depending on whether the rising edge of N*CLK_IN is leading or lagging 1X_CLK_IN, signal C from the synchronizer 205 may or may not be delayed to the next clock cycle of N*CLK_IN. This causes an ambiguity of two N*CLK_IN clock intervals as to exactly when the signal C of the synchronizer asserts.

Figure 3:
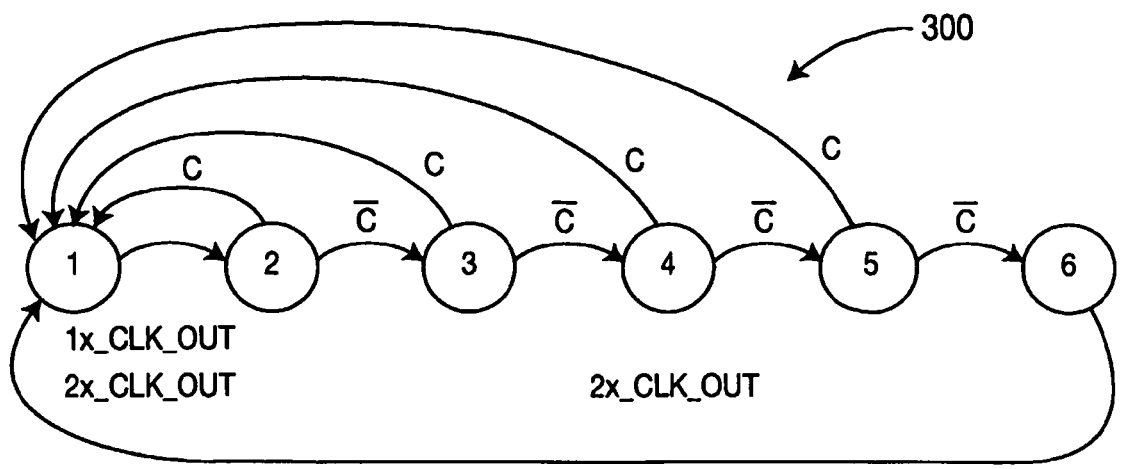
FIG. 3 shows a state diagram for a clock generator state machine, according to an illustrative embodiment of the present invention.

The present invention solves this problem by the way the clock generator state machine 210 frames its behavior to the signal C output of the clock synchronizer. In this example, the clock generator state machine 210 is set up as a divide by 6 counter. Turning to FIG. 3, a state diagram for a clock generator state machine 210 is generally indicated by the reference numeral 300. While the arrangement of the states of the clock generator state machine is shown in a ring configuration, it is to be appreciated that the state arrangement may be implemented using other arrangements. For example, the state arrangement of the clock generator state machine 210 may be any repetitive state sequence. If the clock generator 120 is at an invalid framed state at the assertion of signal C, the state machine 210 will jump to state 1, otherwise, the state machine 210 goes to the next state in the ring. When there is a lag in the N*CLK_IN high frequency signal with respect to the 1X_CLK_IN reference signal, signal C asserts during state 6. To protect the clock generator state machine 210 from erroneously jumping to state 1 in this case, the clock generator state machine 210 is programmed to not reframe during state 6. This is because both state 6 and state 1 are valid states for the signal C assertion signal.

It is to be appreciated that implementations of the present invention are not limited to the first and last state of the plurality of states (see FIG. 3) associated with the clock generator state machine with respect to abstaining from re-synchronization and, thus, abstaining from re-synchronization with respect to any state within a group of adjacent states that is, in turn, within the plurality of states is also contemplated by the present invention while maintaining the spirit thereof. The group of adjacent states may include two or more adjacent states.

Note that during initial start up, it is possible for the state machine 210 to be in state 6 during a leading N*CLK_IN with respect to 1X_CLK_IN condition. This represents a condition in which the state machine 210 is offset by one state from what is desired. Since there is a 50% probability for these signals to be leading or lagging, the state machine 210 will quickly re-synchronize itself in the proper direction almost immediately and then be correct thereafter.

Figure 5:
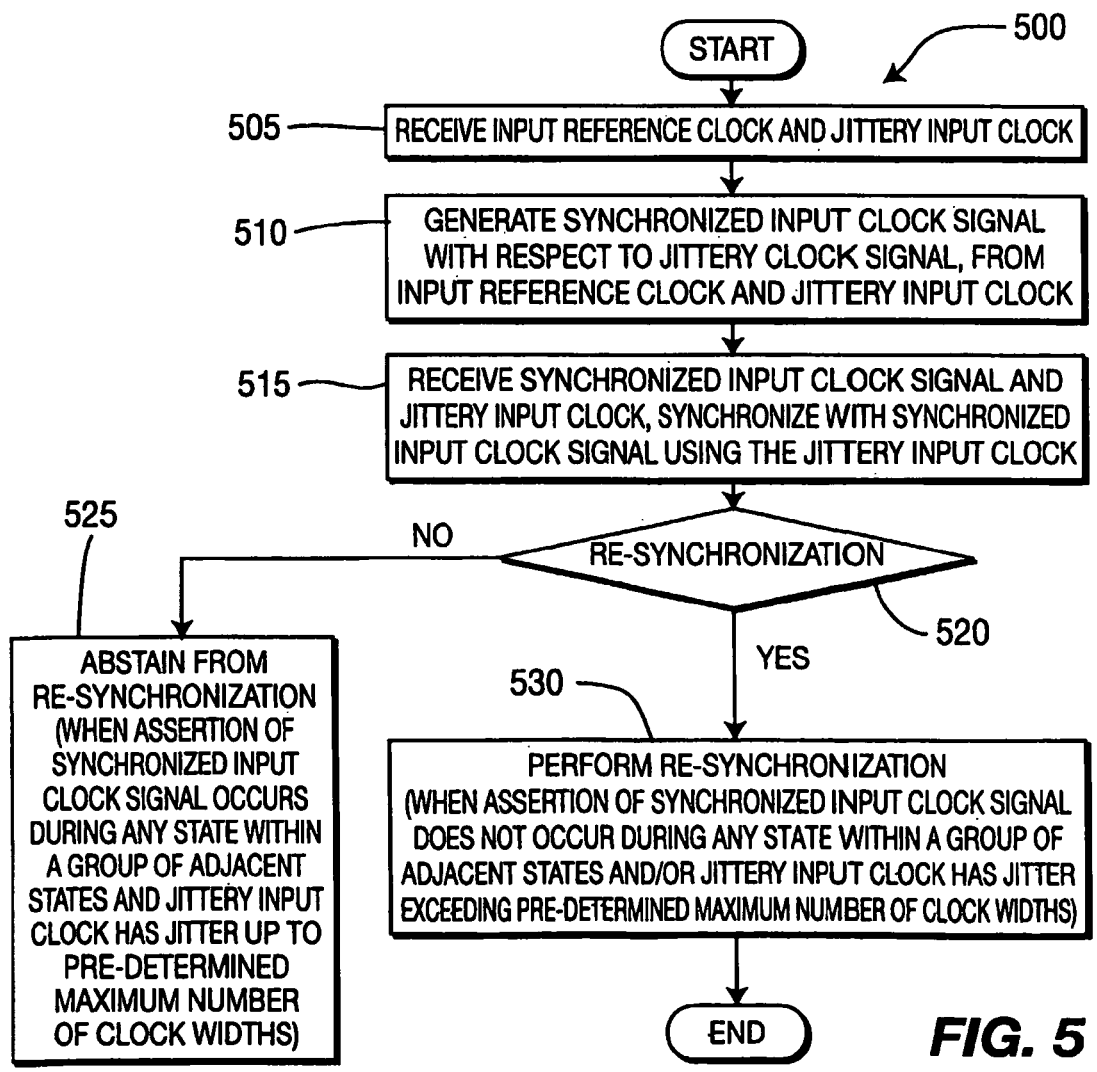
FIG. 5 shows a flowchart for synchronizing a clock generator in the presence of jittery clock sources, according to an illustrative embodiment of the present invention.

Turning to FIG. 5, in a clock generator for generating a plurality of output clock signals, an exemplary flowchart for synchronizing the clock generator to an input reference clock in the presence of a jittery input clock provided to the clock generator from a phase locked loop (PLL) is generally indicated by the reference numeral 500. The clock generator and the PLL each have a divider with a same ratio The input reference clock and the jittery input clock are received (step 505). A synchronized input clock signal is generated with respect to the jittery input clock, from the input reference clock and the jittery input clock (step 510). Steps 505 and 510 are performed by the clock synchronizer 205. The steps hereinafter are performed by the clock generator state machine 210.

The synchronized input clock signal and the jittery input clock are received, and the synchronized input clock signal is synchronized with using the jittery input clock (step 515). Subsequent to synchronization, it may be necessary to perform a re-synchronization. Accordingly, it is determined whether a re-synchronization operation is to be performed (step 520). A re-synchronization operation is abstained from when an assertion of the synchronized input clock signal occurs during any state within a group of adjacent states that, in turn, is within the plurality of sequenced states, and the jittery input clock has a jitter of up to a pre-defined maximum number of clock widths (step 525). Otherwise, a re-synchronization operation is performed when the assertion of the synchronized input clock signal occurs during any state that is not within a group of adjacent states that, in turn, is within the plurality of sequenced states, and/or the jittery input clock does not have a jitter of up to a pre-defined maximum number of clock widths (step 530).

These and other features and advantages of the present invention may be readily ascertained by one of ordinary skill in the pertinent art based on the teachings herein. It is to be understood that the teachings of the present invention may be implemented in various forms of hardware, software, firmware, special purpose processors, or combinations thereof.

Most preferably, the teachings of the present invention are implemented as a combination of hardware and software. Moreover, the software is preferably implemented as an application program tangibly embodied on a program storage unit. The application program may be uploaded to, and executed by, a machine comprising any suitable architecture. Preferably, the machine is implemented on a computer platform having hardware such as one or more central processing units ("CPU"), a random access memory ("RAM"), and input/output ("I/O") interfaces. The computer platform may also include an operating system and microinstruction code. The various processes and functions described herein may be either part of the microinstruction code or part of the application program, or any combination thereof, which may be executed by a CPU. In addition, various other peripheral units may be connected to the computer platform such as an additional data storage unit and a printing unit.

It is to be further understood that, because some of the constituent system components and methods depicted in the accompanying drawings are preferably implemented in software, the actual connections between the system components or the process function blocks may differ depending upon the manner in which the present invention is programmed. Given the teachings herein, one of ordinary skill in the pertinent art will be able to contemplate these and similar implementations or configurations of the present invention.

Although the illustrative embodiments have been described herein with reference to the accompanying drawings, it is to be understood that the present invention is not limited to those precise embodiments, and that various changes and modifications may be effected therein by one of ordinary skill in the pertinent art without departing from the scope or spirit of the present invention. All such changes and modifications are intended to be included within the scope of the present invention as set forth in the appended claims.

The invention claimed is:

1. A clock generator comprising:
   a synchronizer for receiving an input reference clock and a time varying input clock for generating a synchronized input clock signal with respect to a received time varying input clock from a phase locked loop PLL to control digital video processing; and
   a clock generator for synchronizing with the synchronized input clock signal using the time varying input clock and for performing a re-synchronizing operation when the time varying input clock has a time variance outside a pre-defined maximum number of clock widths to reduce jitter during the digital video processing.

2. The apparatus of claim 1, wherein said clock generator is further for internally providing a repetitive state sequence having a plurality of sequenced states equal in number to the ratio of the divider of the clock generator and the phase lock loop PLL and each corresponding to a respective one of the plurality of output clock signals, and wherein the re-synchronization operation is abstained from when an assertion of the synchronized input clock signal occurs during any state within a group of adjacent states that, in turn, is within the plurality of sequenced states and the time varying input clock has the time variance of up to the pre-defined maximum number of clock widths, the group of adjacent states including at least two adjacent states.

3. The apparatus of claim 2, wherein said clock generator progresses to a first state of the plurality of sequenced states when an assertion of the synchronized input clock signal corresponds to an invalid frame state, and progresses to a next state of the plurality of sequenced states when the assertion of the synchronized input clock signal corresponds to a valid frame state.

4. The apparatus of claim 2, wherein the plurality of sequenced states is arranged in a ring configuration.

5. The apparatus of claim 1, wherein the time varying input clock is derived by the PLL from the input reference clock.

6. The apparatus of claim 5, wherein the phase lock loop PLL includes an internal clock divider, and internal clock divider signals of the PLL are one of not observable or available externally from the PLL.

7. The apparatus of claim 1, wherein said clock generator comprises a clock input for receiving the time varying input clock, a data input for receiving the synchronized input clock signal, and a plurality of outputs each for respectively outputting one of the plurality of output clock signals in phase with the input reference clock.

8. The apparatus of claim 1, wherein the time varying input clock is of a higher frequency than the input reference clock.

9. A clock generator method comprising the steps of:
receiving an input reference clock and a time varying input clock from a phase lock loop (PLL);
generating there from a synchronized input clock signal with respect to the time varying input clock;
synchronizing with the synchronized input clock signal using the time varying input clock; and
abstaining from a re-synchronizing operation when the time varying input clock has a time variance of up to a pre-defined maximum number of clock widths.

10. The method of claim 9, further comprising the step of internally providing a repetitive state sequence having a plurality of sequenced states equal in number to the ratio of the divider of the clock generator and the PLL and each corresponding to a respective one of the plurality of output clock signals, and wherein the re-synchronization operation is abstained from when an assertion of the synchronized input clock signal occurs during any state within a group of adjacent states that, in turn, is within the plurality of sequenced states and the time varying input clock has the time variance of up to the pre-defined maximum number of clock widths, the group of adjacent states including at least two adjacent states.

11. The method of claim 10, further comprising the steps of:
progressing to a first state of the plurality of sequenced states when an assertion of the synchronized input clock signal corresponds to an invalid frame state; and
progressing to a next state of the plurality of sequenced states when the assertion of the synchronized input clock signal corresponds to a valid frame state.

12. The method of claim 10, wherein the plurality of sequenced states is arranged in a ring configuration.

13. The method of claim 9, wherein the time varying input clock is derived by the phase lock loop PLL from the input reference clock.

14. The method of claim 13, wherein the phase lock loop PLL includes an internal clock divider, and internal clock divider signals of the PLL are one of not observable or available externally from the PLL.

15. The method of claim 9, wherein the time varying input clock is of a higher frequency than the input reference clock.

\* \* \* \* \*